73-664 SR

XR 2,844,777

SUBSTITUTE FOR MISSING XR

CROSS REFERENCE

SEARCH ROOM

July 22, 1958 J. A. ROSS 2,844,777

VIBRATOR SERVO AMPLIFIERS

Filed Nov. 16, 1955

INVENTOR.
JAMES A. ROSS

BY Harry R. Lubcke
AGENT

United States Patent Office 2,844,777

Patented July 22, 1958

2,844,777

VIBRATOR SERVO AMPLIFIERS

James A. Ross, San Fernando, Calif., assignor to Ling Electronics, Inc., Culver City, Calif., a corporation of California Application November 16, 1955, Serial No. 547,234

19 Claims. (Cl. 318—128)

Figure 1:
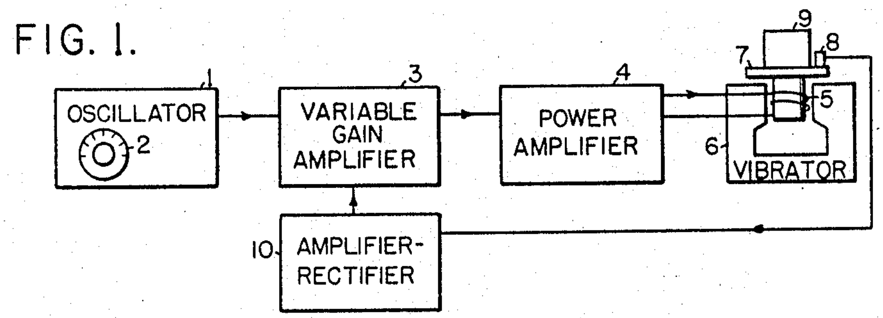

My invention relates to a limiting amplifier and particularly to such an amplifier capable of maintaining the acceleration or other vibrational characteristic of an electromechanical vibrator device constant despite variations in the transfer function of said device with frequency.

Vibrational performance of airplanes and numerous other structures is now being obtained simply and accurately be exciting the same with electrodynamic vibrators, which, in turn, are excited by high power audio frequency amplifiers. These vibrators are of the nature of powerful moving-coil loudspeakers and as such have electrical to mechanical transfer functions which vary widely over the audio and sub-audio frequency bands utilized. Obviously, this lends an unwanted complication to the vibration studies. The prior art has attempted to employ mechanical means to overcome these variations, such as a motor-driven servo controlled potentiometer for varying amplifier gain. This, however, results in sluggish operation.

I have found it possible to accomplish this control all-electronically and thus without sluggishness. The output from an oscillator of variable frequency but of relatively constant amplitude is impressed upon my form of a variable gain amplifier. The output of this amplifier is amplified by a power amplifier and then impressed upon the driving coil of the electro-mechanical vibrator. An accelerometer or similar instrument is attached to the vibrator table. The electrical output therefrom is amplified, rectified and the resulting electrical waveform envelope used to control the gain of the variable gain amplifier. For such frequencies as the transfer function may have a peak response the gain of the variable gain amplifier is reduced accordingly, and vice versa. By this feedback system it is seen that I secure constant mechanical performance from the vibrator regardless of its transfer function or the influence of any electrical entity in the chain.

It should be recognized that my system is unlike known limiting amplifiers such as used in radio and recording operations. In these, a limiting amplifier has the property of limiting the amplitude of what would otherwise be excessive peaks in speech or music that had been impressed upon the input of the amplifier. In my system it is necessary to provide a variable amplitude of electrical output with frequency for a relatively constant amplitude of input with frequency. This is because the amplitude-frequency transfer function of the electrodynamic vibrator is highly variable. Since constant mechanical acceleration, for instance, is desired with frequency the electrical input to the vibrator must be the inverse of the acceleration-frequency transfer function.

It is to be noted in passing that acceleration is an important characteristic of vibration which subjects the test speciment to conditions found later in practice; often several "g's" in magnitude, i. e., several times the acceleration due to the gravity of the earth.

Because it is necessary to operate at sub-audible frequencies in vibration work I have eliminated transformers in the variable gain amplifier and by direct coupling therein have eliminated gain-variation transients, commonly known as "thumps."

An object of my invention is to obtain a constant mechanical vibrational characteristic vs. frequency in an electrodynamic vibrator system.

Another object is to obtain a mechanical acceleration vs. frequency performance which is independent of the electrical to mechanical transfer function of an electrically driven vibrator.

Another object is to accomplish the above results by all-electronic means.

Another object is to accomplish rapidly responsive control in such a system.

Another object is to safeguard an electrically driven vibrational system from damage due to inherent peaks of response of the system.

Another object is to eliminate transformers from a varible gain amplifier and thus allow operation at sub-audible frequencies.

Another object is to eliminate gain-variation transients at the output of a variable gain amplifier.

Another object is to accomplish the above results with apparatus which is of relatively low power, is small and is inexpensive.

Figure 2:
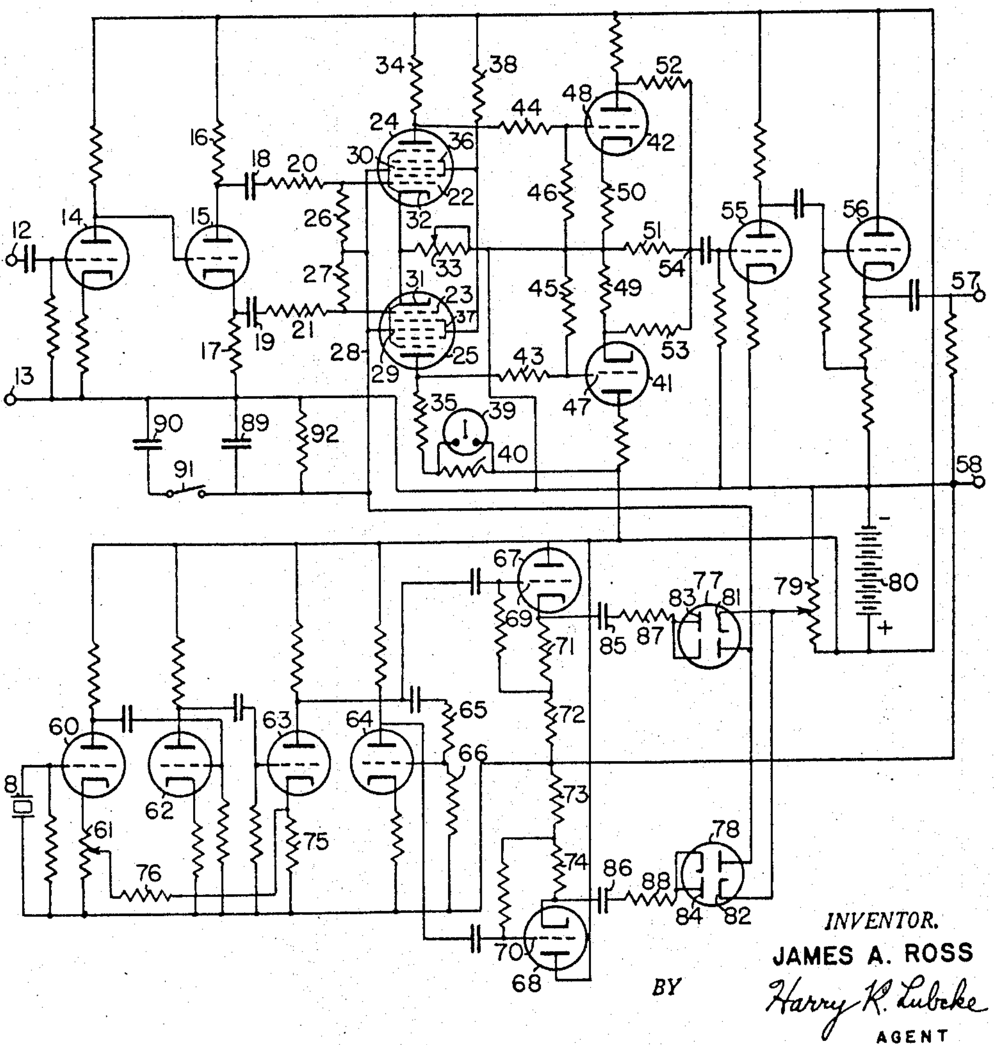

Other objects of my invention will become apparent upon reading the following detailed specification and upon examining the related drawings, in which:

Fig. 1 is a modified block diagram of an electrically driven vibrational system utilizing my servo amplifier, and Fig. 2 is the schematic circuit diagram of my servo amplifier and the connections to the apparatus with which it coacts.

In Fig. 1, numeral 1 indicates an audio and/or sub-audio frequency electrical oscillator having a means 2 for varying frequency, either manually or automatically, but which is not a part of this invention. The oscillator gives a relatively uniform output voltage regardless of the frequency to which it is tuned, although a close approach to uniformity of this output is not required to accomplish the objectives of my invention.

The oscillator output is impressed upon a variable gain amplifier 3, which accepts a single-ended input, modifies this to push-pull for gain variation and then modifies this to single-ended output to feed power amplifier 4. The output of the power amplifier is fed to the moving coil 5 of vibrator (or "shaker") 6, having a table 7 attached to the moving coil. Accelerometer or equivalent 8 is a mechanical to electrical transducer. It may be a barium titanate crystal, which gives a voltage output proportional to the acceleration of the table, to which the item 9 being tested is also bolted.

The output of device 8 is amplified and rectified at 10, from which the rectified output is applied to both sides of the push-pull portion of the variable gain amplifier 3 whenever the same exceeds a predetermined value for control of the gain of that amplifier.

In Fig. 2 the details of my invention are shown. The output of oscillator 1 is connected to input terminals 12 and 13, the latter being at signal ground for single-ended input. Triode 14 and associated components constitute an input amplifier, assuring that any variation of input impedance will not react upon succeeding circuits. The output of this triode is direct-coupled to a second triode 15, which is a plate and cathode output phase inverter, one push-pull output being taken at the plate end of resistor 16 and the other from the cathode end of resistor 17. Appropriate blocking capacitors 18 and 19 and megohm-range isolating resistors 20 and 21 feed the amplified oscillator output to the first control grids 22, 23 of hexode tubes 24 and 25. Resistors 26, 27 are the grid leaks for the first control grids and it should be noted that the junction of these resistors is connected to conductor 28, which conductor carriers the variable gain potential, as will be later described. Similarly, second control grids 29, 30 are directly connected to conductor 28. Cathodes 31, 32 are provided with a positive potential by bias resistor 33, which may be variable. For minimum gain-variation transients tubes 24, 25 should have equal characteristics; i. e., constitute a "balanced" pair and means for separate measurement of cathode current may be employed as well as the variable cathode bias resistor to insure a balance in the original installation of a pair of tubes.

The plate resistors for tubes 24, 25 are 34 and 35 and the common supply voltage dropping resistor for the screen grids 36, 37 is resistor 38.

It is desirable to indicate the amount of gain reduction at which the variable gain amplifier is operating at any time and this is shown by milliammeter 39 which is shunted across low valued resistor 40 in the plate circuit of one of the variable gain tubes 25. This meter may be calibrated in db (decibels) of gain reduction, of which zero to 40 db is a representative range.

Direct coupling will be noted between tubes 24, 25 and 41, 42. This I have found is required to keep gain-variation transients to a low level and thereby accomplish pratical operability. Should coupling capacitors be found in this part of the circuit the device will not be practical. In vibrator practice transients from any source are likely to cause damage to the vibrating assembly and a variable gain amplifier which introduced transients would be of no value.

Resistors 43, 44 in conjunction with grid leaks 45, 46 reduce the plate potentials from tubes 24, 25 by about one-third as applied to grids 47, 48. The loss of signal level is accepted and is adequately recovered in the initial and the final amplifier stages. The cathode resistors 49, 50 are relatively large so that the cathodes of tubes 41, 42 are positive with respect to the grids.

Tube 41 is connected to the apparatus that follows as a cathode output amplifier and thus does not alter the phase of any signal which passes through it. Conversely, tube 42 is connected as a unity gain plate output stage and reverses the phase of any signal which passes through it. The push-pull to single-ended connection is comprised of resistors 51, 52 and 53. Resistor 51 is of comparatively low value and is the output load resistor. Resistors 52 and 53 isolate the considerable different impedances of the two tubes 41 and 42 and are of high value to accomplish true parallel addition of the opposite phases of the push-pull signal desired. Addition occurs because of the 180° phase difference between the two output circuits and the inherent 180° phase difference between the signal in opposite sides of a push-pull amplifier. The high value resistors 52 and 53 equalize the differences in direct current supply potentials occurring at the plate of tube 42 and the cathode of tube 41.

An important function with respect to gain-variation transients occurs at this connection. It will be recalled that any variation of gain potentials upon wire 28 are applied equally to both tubes 24 and 25, and in phase. To the extent that such signals pass beyond these tubes the connection of tubes 41, 42, one being a cathode-follower and the other a plate output tube, is such that in-phase signals cancel at point 54, the signal voltage end of resistor 51. The desired oscillator signal, being in phase-opposed push-pull form, adds, as has been shown. It is now clear how I eliminate transformers and also obtain minimum gain-variation transients ("thumps"), thus accomplishing objects of my invention.

Tube 55 and the components surrounding it comprise an ordinary amplifier stage. Tube 56 and components comprise a cathode-follower output stage, from which connection to the power amplifier 4 of Fig. 1 is made via connections 57, 58.

The remaining tubes in Fig. 2 are concerned with the feedback aspect of the vibrator servo amplifier. Element 8 is the accelerometer crystal. This connects to amplifier tube 60, which has a variable feedback control 61 in the cathode circuit. Amplifier tube 62 is conventional. Stage 63, comprised of tube 63 and accompanying components, is largely conventional but does constitute the first of a phase inverter pair and has a feedback connection on the cathode. Tube 64 is the second of the inverter pair, which is utilized to go from single-ended to push-pull circuitry. Resistors 65 and 66 are a potentiometer to reduce the signal on the grid of tube 64 to a value causing the output from the plate thereof to equal that from the plate of tube 63.

Tubes 67 and 68 are a push-pull cathode-follow pair. Grid 69 of tube 67 is fed from the plate of tube 63, while grid 70 of tube 68 is fed from the plate of tube 64. Resistor 71 has the same value as resistor 74, and resistor 72 the same as resistor 73.

It is desirable that the gain of this amplifier remain constant so that the gain of the system remains as adjusted. Thus, the portion of the amplifier having the greater portion of the gain, from tube 60 to tube 63, is of the negative feedback type. Cathode resistor 75 in tube 63 feeds back through resistor 76 to a selected portion of resistor 61 to stabilize the gain.

The push-pull pair of tubes are utilized to feed a voltage-doubler rectifier pair 77, 78. Output from the rectifier is determined by a reference potential obtained from potentiometer 78. This potentiometer is connected between the positive and negative terminals of the plate voltage supply, represented in Fig. 2 by battery 80, but which is often the known voltage-regulated power supply in practice. As seen, the variable arm of potentiometer 79 connects to cathode 81 of full-wave rectifier 77 and to cathode 82 of full-wave rectifier 78. Until the corresponding anodes 83 and 84 reach potentials more positive than that of the variable arm of the potentiometer there will be no electron flow from said cathodes to said anodes, thus no output from the rectifier as a whole because of the blocking effect of capacitors 85, 86 upon the rectifier, hence "D. C." signal fed as an alternating current from tubes 67, 68.

The full-wave rectified output of tubes 77, 78 is filtered by resistors 87, 88 and capacitor 89. These have a time constant sufficiently large to filter the output to D. C. for usual audio frequencies. Capacitor 90 is shunted across capacitor 89 by switch 91, manually, for sub-audible frequencies. The "attack time" is determined by the time constant of resistors 87, 88 and capacitor 89; that is, the time required for gain to be reduced upon the occurrence of a peak of vibrator response as the frequency of oscillator 1 is varied. This is of the order of a hundredth of a second for the elements recited and about ten times that long when capacitor 90 is connected for operation at sub-audible frequencies.

The "release time," or gradual return to normal gain, is determined by the time constant of capacitor 89 and resistor 92 for audio frequencies and is of the order of a half-second according to the best practice in my embodiment. For sub-audible frequencies this is approximately 5 seconds, capacitor 90 being connected as before.

In this way the control potential for the variable gain portion of my device is obtained upon conductor 28. The further functioning of this potential with the variable gain portion has been previously explained.

I prefer to use a relatively high gain in the control amplifier-rectifier of the order of a hundred times so that I can obtain a signal amplitude of the order of a hundred volts peak at the outputs of the push-pull tubes 67, 68. When voltage-doubled by the rectifier this gives an amplitude of two hundred volts, which is then bucked to zero by an equal voltage setting of potentiometer 79. A relatively small increase in voltage output from accelerometer 8 then gives a relatively large voltage change upon control conductor 28 and the control of the system is sensitive. In a typical embodiment 40 db of compression is available and this is accomplished by only a ten percent change in the output voltage of the accelerometer. I normally prefer to operate the system with 20 db compression. Then variations from normal either upward or downward do not affect the mechanical acceleration of the vibrator.

I have previously described how gain-variation transients are cancelled at point 54 in my device. This cancellation is complete if the gain of the signal path is equal and the phase opposite from the grids of variable gain tubes 24, 25 to point 54. This is usually achieved in practice to a very considerable degree. In addition, however, I arrange for the signal amplitude at the grids of tubes 24, 25 to be relatively large for a stage of this kind. Because of the amplification of tubes 14 and 15 the signal is of the order of a half-volt. Although the gain-varying signal on conductor 28 and hence also applied to the control grids of tubes 24, 25 may become as high as twenty volts, this is still a relatively large signal amplitude to control voltage ratio. This increases the desired signal vs. gain-variation transient residual ratio to a maximum favorable degree.

I have found that waveform distortion is not introduced by my vibrator servo amplifier. The usual waveform distortion in this art is less than a half-percent and the inclusion or removal of my amplifier does not alter this amount.

It should be remarked that my device will operate for any type of signal input source in lieu of oscillator 1. This may be a random noise signal, a specific vibration signal recorded on magnetic tape, and so on. Similarly, by replacing the accelerometer 8 with a transducer sensitive to velocity the system may be controlled according to that vibrational characteristic, and so on.

It is desirable that front-end circuit wiring and components be adequately shielded by placement away from high-level circuits in any embodiment to prevent regeneration.

In Fig. 2 the heater circuits for the cathodes of the several vacuum tubes have not been shown for reason of simplicity. These are conventional.

It is now seen how my vibrator servo amplifier brings improved functioning to the vibration testing art and obsoletes systems devoid of such control.

Various changes in structural and electronic circuit details and modifications of power-handling capability, operating ratios and performance characteristics may be made in my amplifier without departing from the scope of my invention as set forth in the following claims.

Having fully described my invention and the manner in which it is to be practiced, I claim:

1. In an electromechanical system for producing mechanical vibration according to alternations of electrical energy of chosen parameters, means for controlling a characteristic of said vibration regardless of the variation of an operating property of said system affecting said characteristic which comprises push-pull electric amplifying means in said system the amplification of which is alterable by electrical energy, electromechanical means to produce electrical energy proportional to said characteristic of vibration electrically connected to said amplifying means to symmetrically alter the amplification thereof in the sense required to control said characteristic of vibration.

2. In an electromechanical system for producing mechanical vibration corresponding to given electrical alternations, means for maintaining a characteristic of said vibration constant which comprises a symmetrical plural-stage amplier having only resistive and capacitative passive circuit elements in said system the amplification of which is alterable by electrical energy, a mechanical to electrical transducer in said system adapted to produce an electrical output proportional to said characteristic of vibration, said transducer connected to said amplifier to symmetrically vary the amplification thereof according to said electrical energy in the direction required to maintain said characteristic constant.

3. In an electromechanical system for producing mechanical acceleration, means for providing a constant acceleration with frequency which comprises a symmetrical amplifier in said system the amplification of which is determined by the magnitude of electrical energy, an accelerometer attached to the mechanically accelerated portion of said system to produce an electrical output of magnitude proportional to mechanical acceleration, and means to symmetrically apply said electrical magnitude to said amplifier for altering the amplification thereof in the sense required to maintain said acceleration constant.

4. The means for providing a constant acceleration of claim 3 in which the means to apply the electrical output of the accelerometer to the amplifier of alterable amplification comprises a push-pull amplifier connected to said accelerometer, a voltage-doubling rectifier capacitatively connected to said push-pull amplifier and an electrical filter connected to said rectifier and to said amplifier of alterable amplification.

5. In an electromechanical system for producing mechanical acceleration according to alternations of electrical energy, means for maintaining said acceleration constant which comprises a push-pull variable-gain amplifier in the electrical portion of said system the amplification of which is controllable by electrical energy, mechanical to electrical transducing means sensitive to acceleration connected to the mechanical portion of said system, an electrical rectifier, said transducing means electrically connected to said rectifier, said rectifier connected to both sides of said push-pull variable-gain amplifier to supply electrical energy to control the same in the sense to maintain said acceleration constant, a direct-coupled push-pull amplifier connected to the output of the variable gain amplifier having an output circuit in which push-pull electrical energy is reinforced and in which energy introduced to both sides of said variable-gain amplifier is concelled, to the end that said alternations of electrical energy pass through the electrical portions of said system to the mechanical portion but control energy from said rectifier does not.

6. In an electromechanical system for producing mechanical vibration according to alternating electrical energy, means for maintaining a characteristic of said vibration constant which comprises a push-pull amplifying element the amplification of which is controllable by electrical energy, a mechanical to electrical transducer in said system adapted to produce an output of electrical energy proportional to said characteristic, means connected to said transducer to obtain electrical energy proportional to the envelope of the waveform of the electrical output therefrom, and means to symmetrically impress the envelope electrical energy upon said electrically alterable push-pull amplifying element in a sense to maintain said characteristic constant.

7. The means for maintaining a characteristic of the vibration constant of claim 6 in which the means connected to the transducer comprises a constant-gain feedback amplifier, a plurality of diodes non-inductively connected in push-pull to said feedback amplifier and a filter circuit connected to said diodes.

8. In an electromechanical system for producing mechanical vibration having means for controlling a characteristic of said vibration by forming a control signal proportional to the amplitude of said characteristic and impressing said signal upon said means for controlling, the electrical circuit of said means for controlling comprising a push-pull pair of multigrid vacuum tubes, push-pull means to impress a vibrational signal upon corresponding grids of said tubes, other means to impress the same phase of said control signal upon second corresponding grids and upon said corresponding grids of said tubes, a second pair of vacuum tubes push-pull connected by direct coupling to said first pair, and a vibrational signal output taken from a common connection to the plate of one of said second pair of tubes and to the cathode of the other, at which connection the push-pull vibrational signal components add and the same-phased control signal components cancel.

9. The electrical circuit of claim 8 in which the push-pull means to impress a vibrational signal upon corresponding grids of the multigrid vacuum tubes is a plate and cathode output phase-inverting vacuum tube resistive-capacitatively coupled to said multigrid vacuum tubes.

10. In an electromechanical system for producing mechanical vibration having means for controlling a characteristic of said vibration by forming a control signal proportional to the amplitude of said characteristic of vibration and impressing said signal upon said means for controlling, the electrical circuit of said means for controlling comprising a push-pull pair of multigrid vacuum tubes, push-pull means to impress a vibrational signal upon corresponding grids of said tubes, means to originate a control signal, a voltage-doubling rectifier to rectify said control signal, filtering means connected to said rectifier, a connection from said filtering means to each of second corresponding grids and to each of said corresponding grids of said tubes, a second pair of vacuum tubes push-pull connected by direct coupling to said first pair, and a vibrational signal output taken from a common connection to the plate of one of said second pair of tubes and to the cathode of the other, at which connection the push-pull vibrational signal components from opposite sides of the push-pull pairs of tubes add and the same-phased control signal components from said filter cancel.

11. In an electromechanical system for producing mechanical vibration having means to control a characteristic of said vibration by forming a control signal proportional to the amplitude of said characteristic of vibration and impressing said signal upon said means to control, the electrical circuit of said means to control comprising a first vacuum tube having a first resistor connected to the cathode and a second resistor connected to the plate thereof, means to impress a vibrational signal upon the grid thereof, a first capacitor connected to said cathode and a second capacitor connected to the plate of said first vacuum tube, a third resistor connected to the second terminal of said first capacitor and a fourth resistor connected to the second terminal of said second capacitor, a firth resistor series-connected to said third resistor and a sixth resistor series-connected to said fourth resistor, the second terminals of said fifth and sixth resistors connected together and to the source of said control signal; second and third vacuum tubes each having a cathode, plate and at least two grids, the junction between said third and fifth resistors connected to a grid of said second vacuum tube, the junction between said fourth and sixth resistors connected to the corresponding grid of said third vacuum tube, the second corresponding grid in each said second and third vacuum tubes connected to said source of control signal; a seventh resistor connected to the plate of said second vacuum tube and an eighth resistor connected to the plate of said third vacuum tube, a ninth resistor series-connected to said seventh resistor and a tenth resistor series-connected to said eighth resistor, the second terminals of said ninth and tenth resistors connected together; fourth and fifth vacuum tubes each having at least a grid, cathode and plate, the junction between said seventh and ninth resistors connected to the grid of said fourth vacuum tube, the junction between said eighth and tenth resistors connected to the grid of said fifth vacuum tube, an eleventh resistor connected to the plate of said fourth vacuum tube and a twelfth resistor connected to the cathode of said fifth vacuum tube, the second terminals of said eleventh and twelfth resistors connected together and to a common output resistor in which the components of the vibrational signal from said fourth and fifth vacuum tubes combine but the components of the control signal cancel.

12. In an electromechanical system for producing mechanical vibrations at sub-audible frequencies, means to control a characteristic of said vibration which comprises a push-pull variable-gain amplifier in the electrical portion of said system the amplification of which is controllable by electrical energy, mechanical to electrical transducing means sensitive to said characteristic connected to the mechanical portion of said system, an electrical rectifier, said transducing means electrically connected to said rectifier, a filter adapted to filter the electrical output of said rectifier to remove pulsations arising from said vibrations, said filter connected to both sides of said push-pull variable-gain amplifier to supply electrical energy in a sense to control said characteristic, a direct-coupled push-pull amplifier connected to the output of the variable-gain amplifier having a common output circuit in which push-pull electrical energy is reinforced and in which energy introduced to both sides of said variable-gain amplifier is cancelled, to the end that sub-audible alternations of electrical energy pass through an electrical portion of said system to the mechanical portion but control electrical energy from said filter does not.

13. In an electromechanical system for producing mechanical vibration, means for controlling the magnitude of a characteristic of said vibration which comprises a single-ended to push-pull transformerless amplifier, a push-pull variable gain amplifier having vacuum tubes connected to said single-ended to push-pull transformerless amplifier, a push-pull to single-ended transformerless amplifier direct coupled to said variable gain amplifier, mechanical to electrical transducing means to form an output proportional to the amplitude of said characteristic to be controlled, a gain-stabilized amplifier connected to said transducing means, a second single-ended to push-pull transformerless amplifier connected to said gain-stabilized amplifier, a push-pull fixed gain amplifier connected to said second amplifier, a voltage-doubler rectifier connected to said fixed gain amplifier, means to balance out voltage amplitudes less than a selected amplitude coactively connected to rectifier, a filter connected to said rectifier, said filter also connected in the same electrical phase to a plurality of corresponding electrodes in the vacuum tubes of said variable gain amplifier for the control of the amplification thereof in the direction to control the magnitude of said characteristic.

14. In an electromechanical system for producing mechanical vibration having a mechanical vibrator energizable by alternating electrical energy and a mechanical to electrical transducer actuatable by a characteristic of the vibration produced by said vibrator and attached thereto, a variable gain amplifier for automatically adjusting said system to a constant vibration as measured by said characteristic comprising a push-pull variable gain amplifier stage, means to supply a push-pull signal of alternating electrical energy to said stage, a rectifier connected to said transducer, means to supply a signal of the same phase to each side of said variable gain amplifier stage derived from the output of said rectifier and a direct-coupled push-pull to single-ended amplifier connected to the output of said variable gain amplifier stage to pass push-pull alternating signal energy and to cancel said signal of the same phase.

15. In an electromechanical system for producing mechanical vibration having serially connected a source of alternating electrical energy, a power amplifier, a vibrator to alter alternating electrical energy to vibratory mechanical energy and a mechanical to electrical transducer to produce an electrical output proportional to the amplitude of a selected vibration characteristic, a variable gain amplifier for controlling said mechanical vibration according to said selected characteristic comprising an impedance-coupled phase-inverting amplifier connected to said source, a variable gain stage having a pair of plural input amplifying devices connected in push-pull and to said phase-inverting amplifier, a push-pull amplifier stage direct-coupled to said variable gain stage having an asymmetric phase output for combining push-pull electrical energy and cancelling electrical energy having the same phase in each half of said push-pull amplifier stage, said push-pull amplifier stage connected to said power amplifier, an amplifier connected to said transducer having a push-pull output, a rectifier connected to said push-pull output, means to reduce to zero the voltage output of said rectifier that is less than a selected amplitude, a filter connected to said rectifier and to plural inputs of each of said pair of amplifying devices for impressing the same phase of electrical energy originating at said transducer thereon for the variation of gain of said variable gain stage in accord with the electrical energy originating at said transducer.

16. The variable gain amplifier of claim 15 in which the amplifying devices are multigrid vacuum tubes, corresponding grids in each of said tubes being connected to said phase-inverting amplifier and also connected to said filter, and further corresponding grids in each of said tubes being connected only to said filter.

17. The variable gain amplifier of claim 15 in which the asymmetric phase output direct-coupled push-pull amplifier is comprised of a pair of vacuum tubes and the output circuit is formed of a resistor connected to the plate of one of said vacuum tubes and to a common point, a second resistor connected to the cathode of the other of said vacuum tubes and to the common point, and a third resistor of lower resistance value than the other two connected to said common point through which third resistor the signal currents from both said pair of vacuum tubes flow.

18. In an electromechanical system for producing mechanical vibration having serially connected a source of alternating electrical energy, a push-pull variable-gain amplifier stage, a vibrator to alter alternating electrical energy to vibratory mechanical energy and a mechanical to electrical transducer sensitive to a characteristic of said vibratory mechanical energy, a circuit to control said variable-gain amplifier stage comprising a constant gain amplifier having a push-pull output transformerlessly connected to said transducer, said push-pull output connected to a rectifier, potential means connected to said rectifier to oppose the voltage produced in said rectifier by said transducer, and means to symmetrically apply the excess of said voltage from said rectifier over the magnitude of said potential in phase to both sides of said push-pull variable-gain amplifier stage to effect sensitive control of the gain of said variable-gain amplifier stage by said transducer.

19. The circuit of claim 18 in which said means to apply comprises an electrical filter and conductors therefrom to plural corresponding inputs to both push-pull entities of said variable-gain amplifier stage.

References Cited in the file of this patent

UNITED STATES PATENTS

| | | |
|---|---|---|
| 2,326,033 | Hutcheson | Aug. 3, 1943 |
| 2,742,035 | Hancock et al. | Apr. 17, 1956 |